United States Patent
Kondow et al.

(10) Patent No.: US 6,782,032 B2
(45) Date of Patent: Aug. 24, 2004

(54) SEMICONDUCTOR LASER, RAY MODULE USING THE SAME AND RAY COMMUNICATION SYSTEM

(75) Inventors: Masahiko Kondow, Kodaira (JP); Takeshi Kitatani, Hachioji (JP); Makoto Kudo, Hamura (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/154,822

(22) Filed: May 28, 2002

(65) Prior Publication Data

US 2002/0176465 A1 Nov. 28, 2002

(30) Foreign Application Priority Data

May 28, 2001 (JP) ........................................ 2001-158785

(51) Int. Cl.⁷ ................................................ H01S 3/19
(52) U.S. Cl. ............................ 372/92; 372/45; 372/43
(58) Field of Search ............................ 372/50, 43, 46; 437/107, 95

(56) References Cited

U.S. PATENT DOCUMENTS 5,034,958 A * 7/1991 Kwon et al. ................... 372/45
5,168,077 A * 12/1992 Ashizawa et al. ........... 117/102
5,991,321 A * 11/1999 Duggan ........................ 372/45
6,426,522 B1 * 7/2002 Kean et al. .................. 257/191

FOREIGN PATENT DOCUMENTS

JP       11-204875       7/1999

* cited by examiner

Primary Examiner—Don Wong
Assistant Examiner—Dung T Nguyen
(74) Attorney, Agent, or Firm—Miles & Stockbridge P.C.

(57) ABSTRACT

In a semiconductor laser for emitting light perpendicular to substrate crystal, including, on the substrate crystal, an active layer for generating light, a cavity structure sandwiching the active layer by reflecting mirrors so as to obtain a laser beam from the light generated from the active layer, and a regrown semiconductor layer between the active layer and one of the reflecting mirrors, a regrown interface or a face very close to the regrown interface is formed by a thin film containing dopants of high concentration. With the configuration, an adverse influence of a contamination deposit on the regrown interface is eliminated by delta-doping the regrown interface. The cost is reduced and device resistance is also reduced to 50 Ω or less. Thus, an edge emitting laser (VCSEL) for realizing a optical module achieving a high speed characteristic over 10 Gb/s is obtained.

14 Claims, 9 Drawing Sheets

SEMICONDUCTOR LASER, RAY MODULE USING THE SAME AND RAY COMMUNICATION SYSTEM

BACKGROUND OF THE INVENTION

The present invention relates to a semiconductor laser, a optical module using the same, and a optical communication system. More particularly, the invention relates to a semiconductor laser having, on a substrate crystal, an active layer which emits light and a cavity structure for obtaining a laser beam from the light generated from the active layer, in which a regrown layer is formed near the active layer, a optical module having the semiconductor laser as a component, and a optical communication system using the semiconductor laser or optical module.

The speed of information transfer of recent years is requested to be rapidly increased. Consequently, a optical communication of transfer speed of 10 Gb/s or higher is being developed. For a optical communication, usually, a optical module in which a semiconductor laser, a detector, driving circuits for the semiconductor laser, and the like are assembled is used.

As a optical communication system using the optical module and whose transfer speed exceeds 10 Gb/s, a system as shown in FIG. 9 is known. A optical module 907 transmits signal light from a semiconductor laser 901 in accordance with an external circuit 908 which operates the optical module 907. A optical signal transmitted from a optical module on the other side is received by a detector 905 driven by a detector driving circuit 906. All of optical signals are transferred at high speed via optical fibers 909.

As the semiconductor laser 901, an edge emitting laser in which a gallium indium phosphide arsenide (GaInPAs) semiconductor material is used for an active layer is mainly used. Generally, a GaInPAs laser has a drawback such that when device temperature increases, a threshold current largely increases. It is therefore necessary to assemble a thermoelectronic device 904 for stabilizing temperature and an automatic power control (APC) circuit for always measuring fluctuations in a optical output from the semiconductor laser 901 by a detector 903 for monitoring and feeding back the measurement value to a laser driving circuit 902.

Consequently, the number of parts constructing the optical module 907 is large, the driving circuit is complicated and has a large size and, accordingly, the cost of the optical module itself is high.

On the other hand, attention is being paid to a vertical cavity surface emitting laser (VCSEL) as a light source suitable for a high-speed optical module. The vertical cavity surface emitting laser is constructed by an active layer for generating light and an optical resonator taking the form of a pair of reflecting mirrors disposed so as to sandwich a current blocking layer for injecting current to a very small region in the active layer and the active layer. The cavity length of the vertical cavity surface emitting laser is only a few $\mu$m which is much shorter than the cavity length (few hundreds $\mu$m) of an edge emitting laser, and the volume of the active region is small, so that the vertical cavity surface emitting laser has an excellent high-speed characteristic. Further, the vertical cavity surface emitting laser has excellent advantages such that due to an almost circular beam shape, the beam is easily coupled to a optical fiber, a cleavage process is unnecessary, a device inspection on a wafer unit basis can be made, laser oscillation is carried out with a low-threshold current, the power consumption is low, and the cost is also low.

With respect to laser oscillation wavelength, in recent years, oscillation of a vertical cavity surface emitting laser of a 1.3 $\mu$m band made of a new semiconductor material which can be formed on a substrate made of gallium arsenide (GaAs) such as gallium indium nitride arsenide (GaInNAs) or gallium arsenide antimonide (GaAsSb) has been reported one after another. Expectations are running high for practical use of a longer wavelength region vertical cavity surface emitting laser adapted to a single mode fiber capable of performing long-distance high-speed transfer. Particularly, in the case of using GaInNAs for an active layer, electrons can be confined in a deep potential well in a conduction band, and it is expected that the stability of characteristics with respect to temperature can be largely improved.

By the above advantages, if the longer wavelength region vertical cavity surface emitting laser is realized, it is expected that a higher-performance and lower-cost optical module suitable for use in a LAN can be achieved.

The length of the optical resonator of the vertical cavity surface emitting laser is remarkably short. To generate laser oscillation, it is necessary to set the reflectance of upper and lower reflecting mirrors to an extremely high value (99.5% or higher). As a reflecting mirror, a multilayer reflecting mirror obtained by alternately stacking two kinds of semiconductors of different refractive indices having a thickness of a quarter of the wavelength ($\lambda/4$ n: $\lambda$ denotes a wavelength, and n denotes a refractive index of a semiconductor material) is mainly used.

To obtain high reflectance by the smaller number of layers stacked, it is desired that the difference between the refractive indices of the two kinds of semiconductor materials used for the multi-layer reflecting mirror is as large as possible. In the case where the material is semiconductor crystal, to suppress misfit dislocation, it is preferred that the semiconductor crystal is lattice-matched with the substrate material. Under present conditions, a multilayer reflecting mirror made of a GaAs/aluminum arsenide (AlAs) semiconductor material or a dielectric material such as silicon dioxide ($SiO_2$) or titanium dioxide ($TiO_2$) is mainly used. The current blocking layer is indispensable to lower the threshold current, disposed between the active layer and an electrode for passing a current, and plays the role of limiting the current injected to the active layer to a very small region (hereinbelow, described as an aperture). To realize a single lateral mode, the diameter of the aperture has to be small as 2 to 3 $\mu$m at an oscillation wavelength of 850 nm or 5 to 6 $\mu$m at an oscillation wavelength of 1300 nm. Concretely, a method of selectively oxidizing an AlAs layer introduced into a device structure in the lateral direction to change the layer to an aluminum oxide ($Al_xO_y$) insulating layer, thereby blocking current only by a very small AlAs region remained in the center is in the mainstream at present. There is also a method of blocking current by burying either a semiconductor material having a large band gap or a material doped with an impurity of a conduction type opposite to the conduction type of the device.

On the other hand, in order to realize a optical module having a high speed characteristic over 10 Gb/s, a vertical cavity surface emitting laser used as a light source has to achieve a high speed characteristic over 10 Gb/s. Consequently, it is indispensable to reduce resistance (R) and capacity (C) of the vertical cavity surface emitting laser. FIG. 5 shows the relations of resistance, capacity, and modulation characteristic. The capacity of a vertical cavity surface emitting laser is generally a few hundreds fF. To achieve high-speed modulation over 10 Gb/s, the device resistance has to be reduced to at least 50 $\Omega$ or lower.

For a vertical cavity surface emitting laser, as described above, a multi-layer reflecting mirror made of an AlAs/GaAs semiconductor is mainly used. In a conventional device, an electrode is disposed on an upper p-type AlAs/GaAs semiconductor multilayer reflecting mirror and a current is injected to an active layer via the semiconductor multilayer reflecting mirror. At this time, there is a problem that the energy difference of a valence band of the AlAs/GaAs semiconductor becomes a large resistance component in a heterojunction for holes having a heavy effective mass and increases device resistance. As countermeasures against the problem, attempts to, for example, reduce resistance components in the heterojunction by introducing an AlGaAs semiconductor layer whose composition is gradually changed to the AlAs/GaAs heterojunction and doping only the AlAs side with p-type impurity have been made. However, it is very difficult to achieve device resistance of 50 Ω or less in a device having an aperture of a small diameter realizing a single lateral mode.

A vertical cavity surface emitting laser having a structure of injecting a current not via an upper semiconductor multilayer reflecting mirror of high resistance is also being examined. As an example, FIG. 6 is a diagram showing the device structure of a vertical cavity surface emitting layer disclosed in Japanese Unexamined Patent Application No. Hei-11-204875, developed by the inventors herein. Shown are an n-electrode 601, an n-GaAs substrate 602, a lower multilayer reflecting mirror 603, a first GaAs spacer layer 604, a non-doped GaInNAs active layer 605, a second GaAs spacer layer 606, a current blocking layer 607, a p-current feeding layer 608, a third p-GaAS spacer layer 609, a p-electrode 610, and an upper multilayer reflecting mirror 611.

A current injected from the p-electrode 610 passes through the third spacer layer 609 and the current feeding layer 608, is led to an aperture defined by the current blocking layer 607, and fed to the active layer 605. That is, the current does not pass through the upper multilayer reflecting mirror 611, the device resistance is reduced. Further, in the structure, the current feeding layer 608 of which doping concentration is increased to $p=1\times10^{20}$ cm$^{-3}$ is introduced, thereby realizing reduction in resistance components between the electrode and the aperture. Therefore, in the structure, device resistance of 50 Ω or less can be achieved in a device having a small-diameter aperture realizing the single lateral mode.

However, when a number of lots of vertical cavity surface emitting lasers shown in FIG. 6 were manufactured in practice, although devices having very excellent characteristics in which a resistance value is about 20 Ω were obtained, a problem such that reproducibility of characteristics among lots is low occurred. Particularly, devices having abnormally high resistance value and having bad electric characteristics were also manufactured. The cause was tracked down by the inventors herein and determined that something is wrong with the junction face between the third GaAs spacer layer 609 and the second GaAs spacer layer 606 as a part of the aperture. The junction face is a regrown interface formed by selectively etching the current blocking layer 607 and the current feeding layer 608 and regrowing the third spacer layer 609. Due to a malfunction in a regrowing process, the characteristics deteriorate.

Concretely, there is a case that reproducibility of etching of a small amount performed before regrowing is low, and crystallization of the interface is insufficient. On the other hand, if the small-amount etching process is omitted, Si is adhered to the interface for some reason in a process of selectively etching the current blocking layer 607 and current introducing layer 608, and the conduction type of the interface becomes an n-type. Even if the p-type third spacer layer 609 is regrown later, a p-n junction and a depletion layer caused by the p-n junction are formed and become a large resistance component.

SUMMARY OF THE INVENTION

A first object of the invention is to realize a semiconductor laser in which an influence of an impurity deposited on a regrown interface between electrodes of a semiconductor device is reduced.

A second object of the invention is to provide a high-speed and high-performance vertical cavity surface emitting laser having therein a regrown interface between electrodes, with reduced resistance between the electrodes without variations in characteristics when a number of lots are formed, and economical (low-cost) optical module and optical communication system with a simple configuration each using the vertical cavity surface emitting laser.

To achieve the objects, in a semiconductor laser of the invention having a plurality of semiconductor layers formed in a regrowing process between electrodes, a regrown interface or a face very close to the regrown interface is formed by a thin film containing dopants of high concentration.

To achieve the objects, a vertical cavity surface emitting semiconductor laser of the invention for emitting light perpendicular to substrate crystal has, on the substrate crystal, an active layer for generating light, a cavity structure in which the active layer is sandwiched reflecting mirrors to obtain a laser beam from the light generated from the active layer, and a regrown semiconductor layer provided between the active layer and one of the reflecting mirrors, and a regrown interface or a face very close to the regrown interface is formed by a thin film containing dopants of high concentration.

As the dopant, a dopant having a low diffusion constant is suitable and carbon is optimum. The delta doping performed to a position within 10 nm from the interface is substantially the same as the delta doping performed on the regrown interface since carriers move to the interface by a tunnel effect. The thickness of a layer to be delta-doped is 10 nm or less in consideration of a fabricating error.

According to the invention, in the semiconductor laser in which the regrown interface or a face very close to the regrown interface contains dopants of high concentration, by performing delta doping with a p-type dopant, the adverse influence of Si as an n-type dopant described by referring to FIG. 6 is lessened, and a resistance component of a p-n junction and a depletion layer caused by the p-n junction can be canceled. Specifically, a substance which is adhered on the interface and contaminates the interface is Si. On the contrary, in the case where a substance as a p-type dopant is adhered, by delta doping with an n-type dopant, the adverse influence of the p-type dopant can be canceled. The regrowing process is widely used also for semiconductor devices other than the vertical cavity surface emitting laser. The delta doping performed on the regrown interface to electrically lessen the contaminant deposit is effective to improve the interface and the device characteristics.

In a preferred embodiment of the vertical cavity surface emitting laser of the invention, in the vertical cavity surface emitting laser, the regrown interface is formed in a position close to the position of a node of a standing wave (preferably, in a position close to the position of the node within a distance of a ⅛ wavelength or less).

The positions of the anti-node and node of a standing wave are uniformly determined by the distance from a reflecting mirror and an oscillation wavelength considering a refractive index of a substance in the cavity. The distance between the cavity components is accurately an integer times of the ½ wavelength thickness, and the anti-node exists every ½ wavelength thickness. Generally, the active layer is placed in the position of the anti-node of the standing wave in order to obtain the maximum gain (however, the position of the active layer does not determine the position of the anti-node of the standing wave). In this case, the nodes of the standing wave exists in positions of ¼, ¾, and ⁵⁄₄ wavelength thickness from the active layer. As shown in FIG. 7, when the position of the regrown interface is set in the node of the standing wave, since no light exists in the position of the node, the regrown interface does not become a factor of absorption and scattering. How a loss of light is influenced by the position of the interface was simulated. FIG. 8 shows the result of simulation of a reflection spectrum of an AlAs/GaAs multilayer reflecting mirror (25 cycles) having an interface subjected to C delta doping, serving as an optical absorber. The difference between 100% and reflectance indicates a loss of light. A loss in the case where the interface is in the position of the node is 0.04% which is the same as that in the case where there is no interface subjected to C delta doping.

On the other hand, in the case where the interface is in the position of the anti-node, a loss is 0.17% which is more than four times. Generally, in the vertical cavity surface emitting laser having a high density of light, increase of a loss largely exerts an influence on the optical characteristics of the device. Therefore, due to increase in a loss of four times, the efficiency does not simply deteriorate to ¼ but oscillating operation itself may be checked.

Although the C delta doped interface is used as a factor of causing a light loss in the interface in the above simulation to simplify quantification, a similar result is obtained in the case of a regrown interface. When the interface is positioned, not necessarily in the accurate position of the node, within ±⅛ wavelength thickness from a node, an effect at improving the characteristics of the vertical cavity surface emitting semiconductor laser is produced.

In the case where the thin film or the regrown interface containing the dopant is formed near the position of a node of a standing wave, an effect that both static characteristic and luminance characteristic of a semiconductor laser are improved is produced.

DESCRIPTION OF THE PREFERRED EMBODIMENTS

Although each of vertical cavity surface emitting lasers of examples described hereinbelow have a p-junction interface, means for canceling a light loss caused by a regrown interface by adjusting the position of the regrown interface to the node of a standing wave does not depend on the conduction type of the interface.

FIRST EXAMPLE

Figure 1:
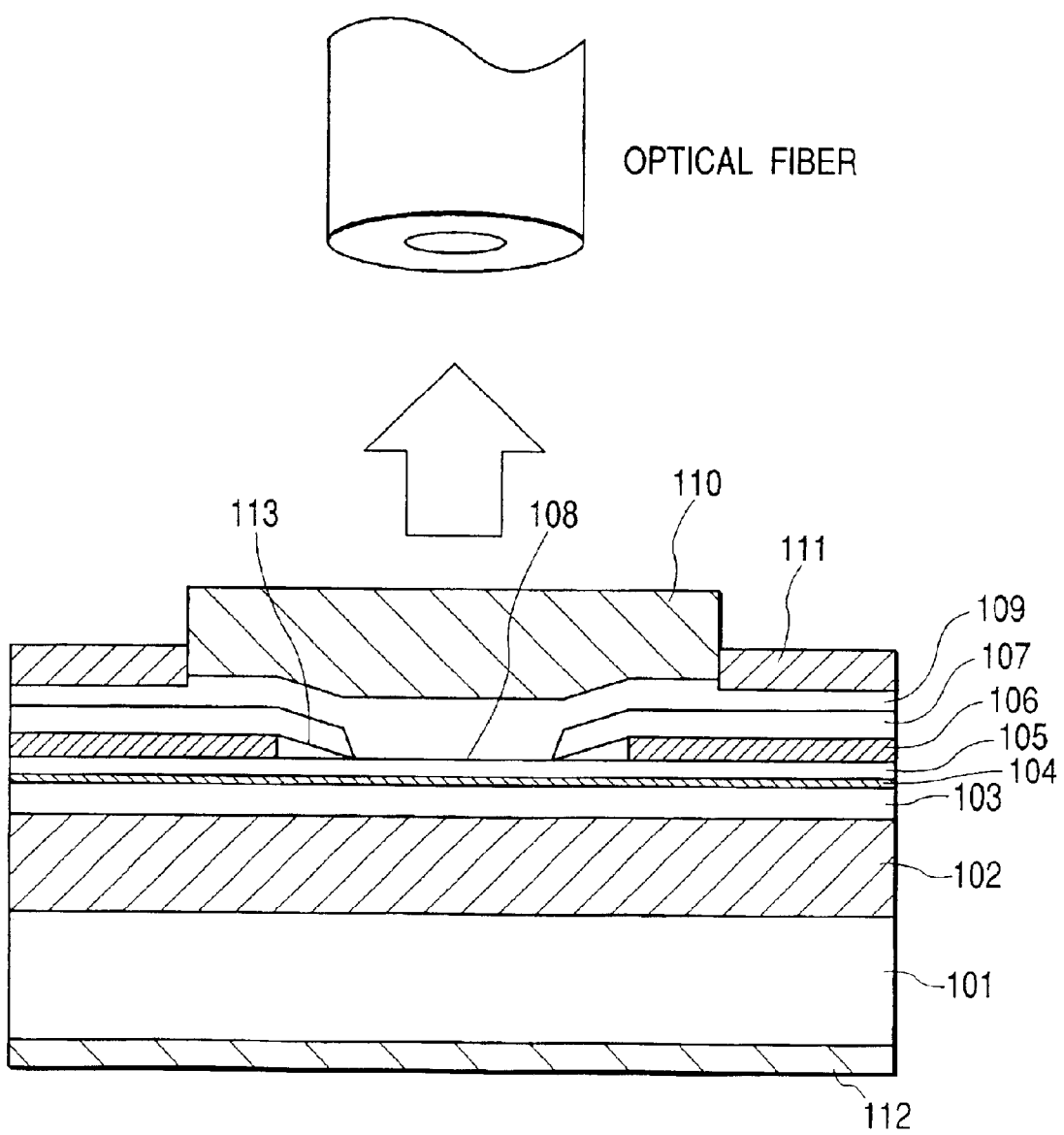
FIG. 1 is a cross section of an example of a vertical cavity surface emitting semiconductor laser device according to the invention.

FIG. 1 is a cross section showing the structure of an example of a vertical cavity surface emitting laser according to the invention.

The vertical cavity surface emitting laser for emitting light perpendicular to a substrate crystal has, on a substrate crystal 101, an active layer 104 for emitting light and a cavity structure in which the active layer 104 is sandwiched by upper and lower reflecting mirrors 102 and 110, semiconductor layers of a second spacer layer 105 and a third spacer layer 109 which is formed by a regrowing process over the spacer layer 105 are provided between the active layer 104 and one (110) of the reflecting mirrors.

A regrown interface 108 is formed in a position close to the position of the node of a standing wave by a distance shorter than a ⅛ wavelength. The light wavelength in the embodiment is 1.3 μm. A concrete configuration and fabricating method will be described hereinbelow.

Shown in FIG. 1 are the n-type GaAs substrate 101 ($n=1\times10^{18}$ cm$^{-3}$, d=300 μm), the n-type GaAs/AlAs semiconductor multilayer reflecting mirror 102 ($n=1\times10^{18}$ cm$^{-3}$), an n-doped first GaAs spacer layer 103 ($n=1\times10^{18}$ cm$^{-3}$, d=½ wavelength thickness), a non-doped GaInNAs/GaAs strained quantum well active layer 104, a p-doped second GaAs spacer layer 105 ($p=1\times10^{17}$ cm$^{-3}$, d=¼ wavelength thickness), an n-type Ga(0.5)In(0.5)P current blocking layer 106 ($n=1\times10^{18}$ cm$^{-3}$, d=50 nm) which is lattice-matched with the GaAs substrate, a p-type GaAs current feeding layer 107 ($p=1\times10^{20}$ cm$^{-3}$, d=½ wavelength thickness), the regrown interface 108, the p-type third GaAs spacer layer 109 ($p=1\times10^{18}$ cm$^{-1}$, d=¾ wavelength thickness), a non-doped GaAs/AlInP semiconductor multilayer reflecting mirror 110, a p-side electrode 111, and an n-side electrode 112.

The lower semiconductor multilayer reflecting mirror 102 is obtained by alternately stacking a GaAs layer of a high refractive index having a thickness of a ¼ wavelength and an AlAs layer of a low refractive index having a thickness of a ¼ wavelength. The number of layers stacked is 25 pairs so that the reflectance becomes 99.5% or higher. As the active layer 104, the strained quantum well layer having an effective band gap of 0.95 eV (wavelength: 1.3 μm) obtained by sandwiching a GaInNAs well layer having a thickness of 7 nm by GaAs barrier layers each having a thickness of 10 nm is used. The thickness of each of the first and second spacer layers 103 and 105 is, to be accurate, a thickness from which the half of the thickness of the active layer 104 is subtracted. As a result, the length of the cavity is accurately equal to the thickness of 1.5 wavelengths.

The semiconductor layers 102 to 107 are obtained by growing crystal continuously in a high vacuum of 1×10⁻⁷ Torr by using a gas source molecular beam epitaxial growth system. Metal aluminum, gallium, and indium are used as group III materials, and metal arsenic, phosphine, and nitrogen excited by plasma are used as group V materials. As dopant materials, Si and CBr4 are used. A wafer is taken out and, by a photolithographic process, as shown in FIG. 1, the p-type GaAs current feeding layer 107 and the current blocking layer 106 are sequentially selectively etched with a sulfuric acid etchant and a hydrochloric acid etchant to thereby form an aperture having a diameter of 5 µm. The wafer is put again in a crystal growth system and irradiated with a beam of CBr4 together with arsenic, thereby performing C delta doping on the regrown interface at a density of $p=1\times 10^{12}$ cm⁻².

After that, the third GaAs spacer layer 109 is regrown. The regrown interface is in the position of the ¾ wavelength thickness from the under face of the upper reflecting mirror, which is at the node of the standing wave. At the time of selectively etching the current blocking layer 106, by controlling the etching time, a cavity 113 is formed. At the time of regrowth, the p-type GaAs current feeding layer 107 over the cavity 113 is deformed and the cavity 113 is tapered. Consequently, light loss in the portion where the aperture and the cavity 113 are in contact with each other decreases, and the optical characteristics of the device are improved. The difference between the refractive index of GaAs in the aperture and the refractive index in the vacuum of the cavity on the outside is large, so that single lateral mode oscillation can be easily obtained.

Subsequently, the upper semiconductor multilayer reflecting mirror 110 is grown. The upper semiconductor multilayer reflecting mirror 110 is obtained by alternately stacking a GaAs layer having a thickness of a ¼ wavelength and an Al(0.5)In(0.5)P layer which is lattice-matched with the GaAs substrate having the thickness of the ¼ wavelength. The number of layers stacked of the reflecting mirror layer is set to 25 pairs so that the reflectance becomes 99.5% or higher. Subsequently, the outside of the upper multilayer reflecting mirror 110 is dry etched to the second GaAs spacer layer 109. After that, the ring-shaped p-side electrode 111 having an inside diameter of 7 µm and an outside diameter of 15 µm and the n-side electrode 112 are formed. Finally, the outside of the ring-shaped p-side electrode 111 is etched to perform device isolation.

When a current was injected to the vertical cavity surface emitting layer, laser oscillation was carried out with a threshold current of 100 µA. A laser beam was emitted from the dielectric multilayer reflecting mirror side, and the oscillation wavelength at a room temperature was 1.3 µm. The vertical cavity surface emitting laser had a long device life of 100,000 hours or longer. The yield in a plurality of lots was as high as 70% or higher. The performances are very excellent for a long wavelength region vertical cavity surface emitting laser. A vertical cavity surface emitting laser device having a 1.3 µm band can be also fabricated by using a material such as GaAsSb for the active layer.

SECOND EXAMPLE

Figure 2:
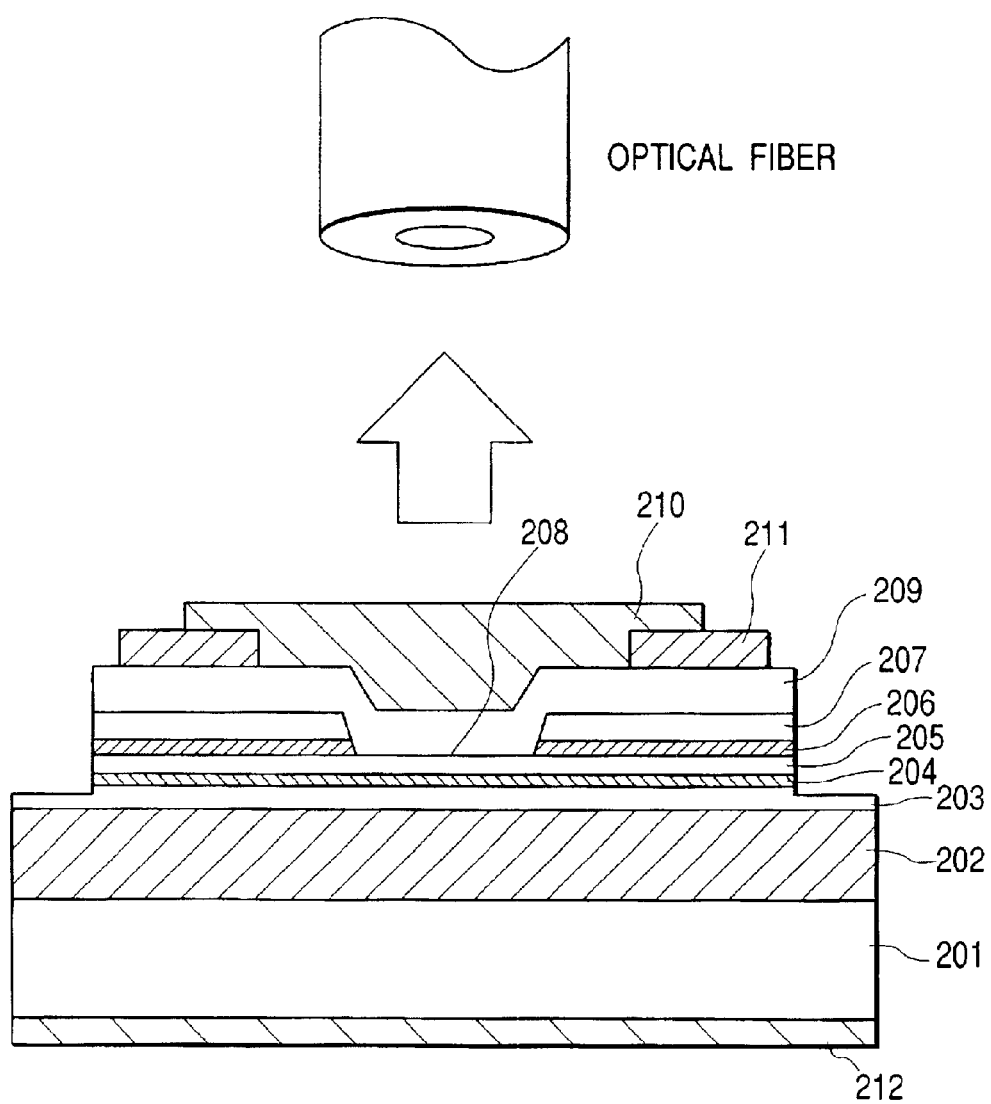
FIG. 2 is a cross section of another example of a vertical cavity surface semiconductor laser device according to the invention.

FIG. 2 is a cross section showing the structure of another example of a vertical cavity surface emitting laser according to the invention. The vertical cavity surface emitting laser for emitting light perpendicular to a substrate crystal has, on a substrate crystal 201, an active layer 204 for emitting light and a cavity structure in which the active layer 204 is sandwiched by upper and lower reflecting mirrors 202 and 210 to obtain a laser beam from the light generated from the active layer 204. Semiconductor layers of a second spacer layer 205 and a third spacer layer 209 which is formed by a regrowing process over the spacer layer 205 are provided between the active layer 204 and one (210) of the reflecting mirrors.

A regrown interface 208 is formed in a position close to the position of the node of a standing wave by a distance shorter than a ⅛ wavelength. The light wavelength in the embodiment is 0.98 µm. A concrete configuration and fabricating method will be described hereinbelow. Shown are the n-type GaAs substrate 201 ($n=1\times 10^{18}$ cm⁻³, d=100 µm), the n-type GaAs/AlAs semiconductor multilayer reflecting mirror 202 ($n=1\times 10^{18}$ cm⁻³), an n-doped first GaAs spacer layer 203 ($n=1\times 10^{17}$ cm⁻³, d=½ wavelength thickness), a non-doped GaInNAs/GaAs strained quantum well active layer 204, a p-doped second GaAs spacer layer 205 ($p=1\times 10^{17}$ cm⁻³, d=¾ wavelength thickness), an AlInO$_x$ current blocking layer 206 (d=100 nm) obtained by selectively oxidizing Al(0.5)In(0.5)P which is lattice-matched with the GaAs substrate, a p-type GaAs current feeding layer 207 ($p=1\times 10^{20}$ cm⁻³, d=½ wavelength thickness), the regrown interface 208, the p-type third GaAs spacer layer 209 ($p=1\times 10^{18}$ cm⁻³, d=¾ wavelength thickness), an SiO₂/TiO₂ dielectric multilayer reflecting mirror 210, a p-side electrode 211, and an n-side electrode 212. The semiconductor multilayer reflecting mirror 202 is obtained by alternately stacking a GaAs layer of a high refractive index having a thickness of a ¼ wavelength and an AlAs layer of a low refractive index having a thickness of a ¼ wavelength. The number of layers stacked of the reflecting mirror layer is set to 25 pairs so that the reflectance becomes 99.5% or higher. As the active layer 204, a strained quantum well layer having an effective band gap of 1.27 eV (wavelength: 0.98 µm) obtained by separating a GaInNAs well layer of three layers having a thickness of 7 nm by a GaAs barrier layer having a thickness of 10 nm is used. The thickness of each of the first and second spacer layers 203 and 205 is, to be accurate, a thickness from which the half of the thickness of the active layer 204 is subtracted. As a result, the length of the cavity becomes accurately the thickness of 2 wavelengths.

The semiconductor layers 202 to 207 are obtained by growing crystal continuously in a high vacuum of 50 Torr by using a metal organic vapor phase epitaxial growth system. Metal trimethyl aluminum, trimethyl gallium, and trimethyl indium are used as group III materials, and dimethyl hydrazine, phosphine, and arsine are used as group V materials. As dopant materials, disilane, dimethyl zinc are used. A wafer is taken out and, as shown in FIG. 2, by a photolithographic process, the p-type GaAs current feeding layer 207 and the current blocking layer 206 are sequentially selectively etched with a sulfuric acid etchant and a hydrochloric acid etchant to thereby form an aperture having a diameter of 3 µm.

The wafer is put again in the epitaxial growth system and the third GaAs spacer layer 209 is regrown. The portion of 10 nm in contact with the regrown interface 208, of the third GaAs spacer layer 209 is highly doped at $p=1\times 10^{20}$ cm⁻³, thereby effectively performing delta doping. The regrown interface 208 is in the position of the ¾ wavelength thickness from the under face of the upper reflecting mirror, which is at the node of the standing wave.

Subsequently, the outside of the portion where the ring-shaped p-side electrode 211 is to be formed is etched to some midpoint in the first GaAs spacer layer 205, thereby performing device isolation. After that, AlInP is selectively oxidized from the peripheral portion in high-temperature steam to thereby form the AlInOx current blocking layer 206. Since no AlInP exists in the aperture portion, the selective oxidation of AlInP is stopped in the aperture portion with reliability, so that the diameter of the aperture can be controlled with high precision.

Subsequently, the ring-shaped p-side electrode 211 having the inside diameter of 10 $\mu$m and the outside diameter of 15 $\mu$m is formed by the lift off method. After that, the dielectric multilayer reflecting mirror 210 was formed by sputter deposition. The dielectric multilayer reflecting mirror 210 is fabricated by alternately stacking a $TiO_2$ layer of a high refractive index having a thickness of a ¼ wavelength and an $SiO_2$ layer of a low refractive index having a thickness of a ¼ wavelength in dielectric. The number of layers stacked is set to 7 pairs so that the reflectance becomes 99% or higher. After that, as shown in FIG. 2, the outside of the dielectric multilayer reflecting mirror 210 is etched with a Cl reactive ion beam to thereby expose the p-side electrode 211. Finally, the n-side electrode 212 is formed.

When a current was passed to the vertical cavity surface emitting layer, laser oscillation was carried out with a threshold current of 10 $\mu$A. A laser beam was emitted from the dielectric multilayer reflecting mirror side, and the oscillation wavelength at a room temperature was 0.98 $\mu$m. The vertical cavity surface emitting laser had a long device life of 100,000 hours or longer. When the active layer is made of GaAs or the like and AlGaAs or the like is used for the spacer layer and a layer having a high refractive index of a multilayer reflecting mirror, the layers become transparent with light of 1 $\mu$m or less. The invention can be therefore applied to a vertical cavity surface emitting laser having a wavelength of 1 $\mu$m or less such as 0.85 $\mu$m.

THIRD EXAMPLE

Figure 3:
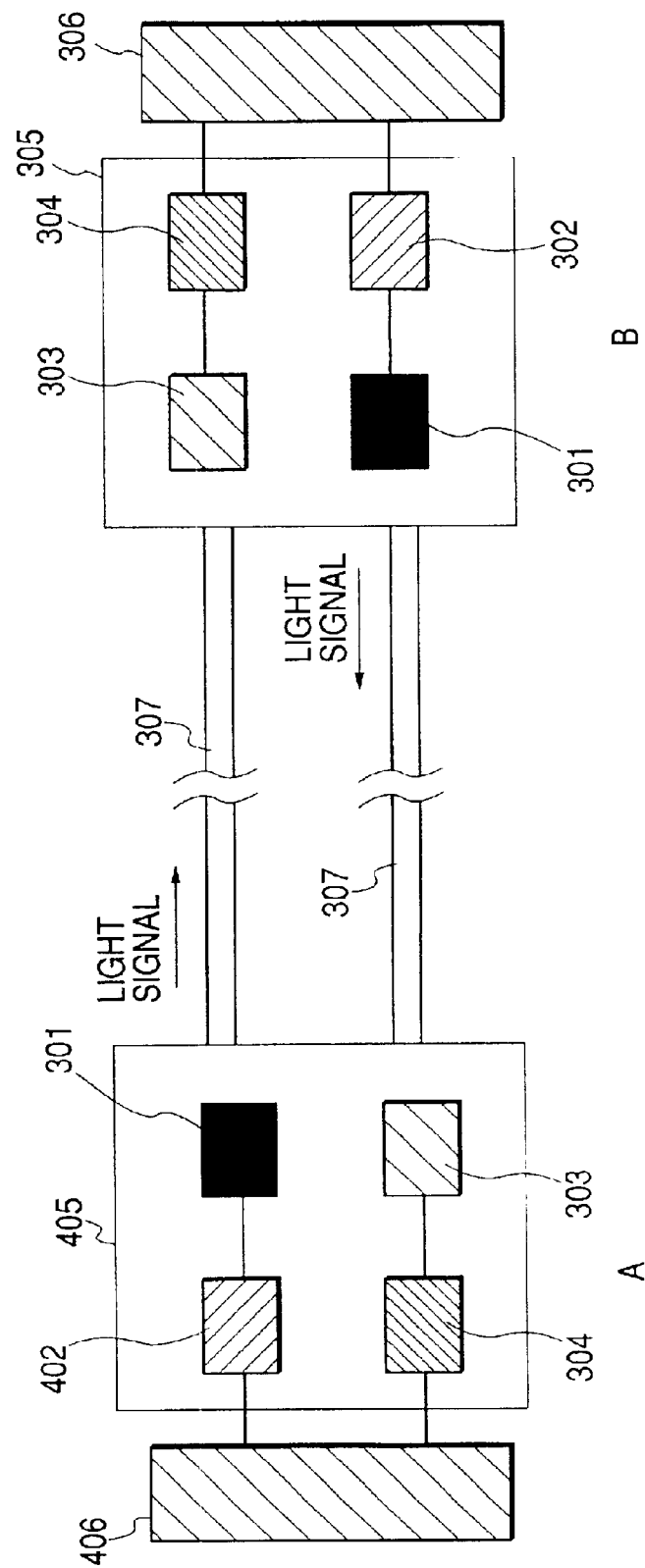
FIG. 3 is a configuration diagram of a optical communication system using a semiconductor laser of the invention.

FIG. 3 is a block diagram showing the configuration of an embodiment of a optical communication system using the optical module according to the invention. The diagram shows, for simplicity, a optical communication system in which two terminals A and B are connected to each other via two optical fibers 307, and the terminals A and B have the same configuration. Each terminal is constructed by a optical module package 305 for transmitting/receiving a light signal, and an external circuit 306 for operating the optical module 305. The optical module 305 has a vertical cavity surface emitting laser 301 according to the invention of the foregoing embodiment, a laser driving circuit 302 for driving the vertical cavity surface emitting laser 301, a detector 303, and a detector driving circuit 304.

The vertical cavity surface emitting laser 301 has low device resistance, so that heat generation of the device itself is small, and temperature fluctuations are small. In addition, the threshold current value of the vertical cavity surface emitting laser itself is small. Consequently, a change in the threshold current value at the time of use is very small. It enables the device to be driven by a small and simple circuit. Therefore, a thermoelectronic device and an APC circuit which are necessary for the conventional high-speed optical module shown in FIG. 4 become unnecessary. Thus, the number of parts can be largely reduced, and the size of the driving circuit can be reduced. The size of the optical module itself is accordingly reduced, so that much lower cost can be realized. High yield at the time of fabricating the device is also effective at lowering the cost. Further, in the optical module, since resistance of the vertical cavity surface emitting laser is low and heat generation of the device itself is small, the active layer does not easily deteriorate. Therefore, stable characteristics for longer time as compared with the conventional optical module can be provided. The above-described effects are more conspicuous in a vertical cavity surface emitting laser using an active material having an excellent temperature characteristic capable of confining electrons in a deep potential well in the active layer, such as GaInNAs.

FOURTH EXAMPLE

Figure 4A:
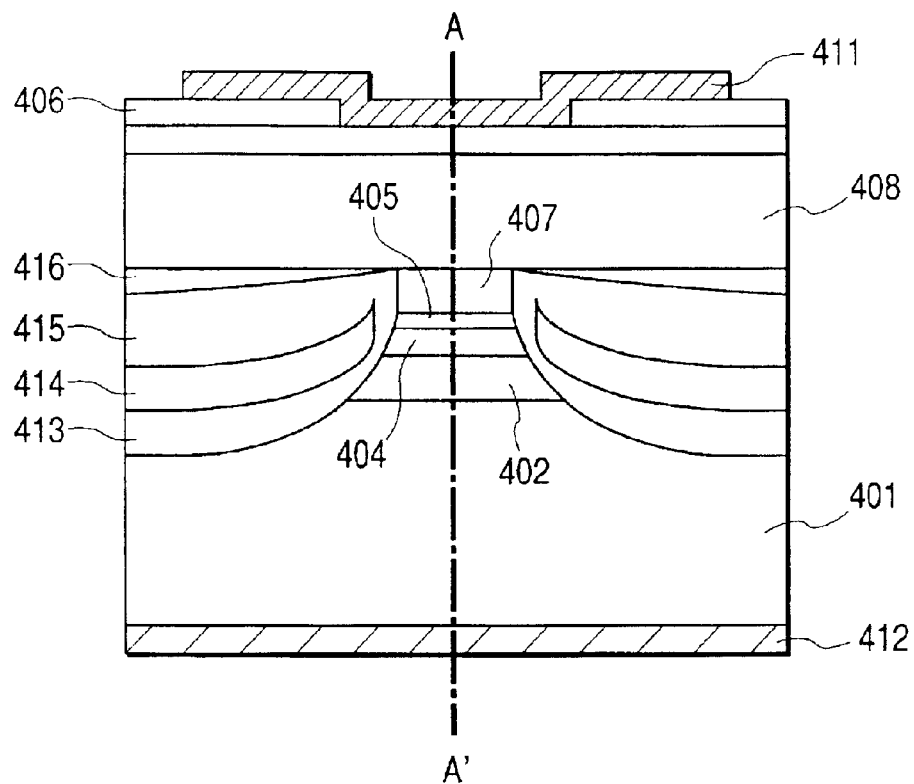
FIG. 4 is a cross section of another example of a vertical cavity surface emitting semiconductor laser device according to the invention.
Figure 4B:
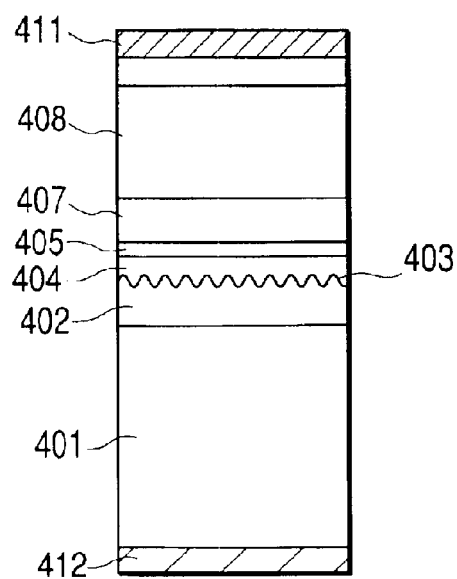
Figure 5:
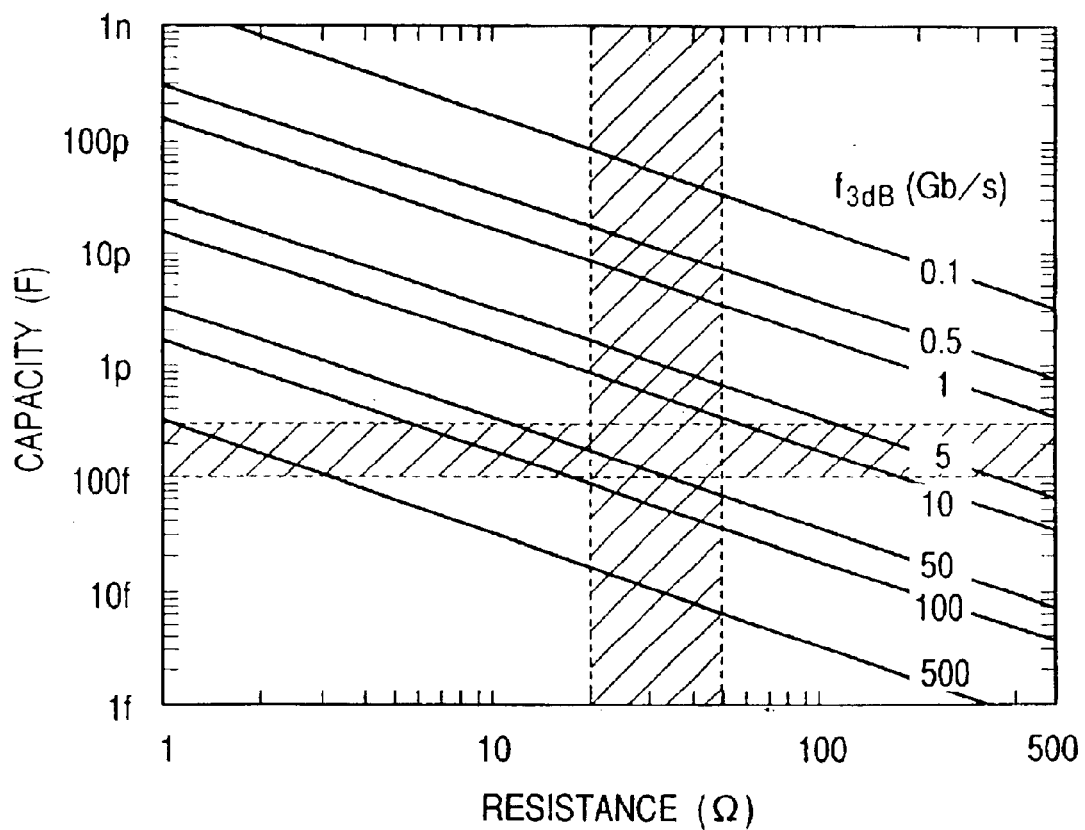
FIG. 5 is a diagram showing the relations of resistance, capacity, and modulation characteristics.
Figure 6:
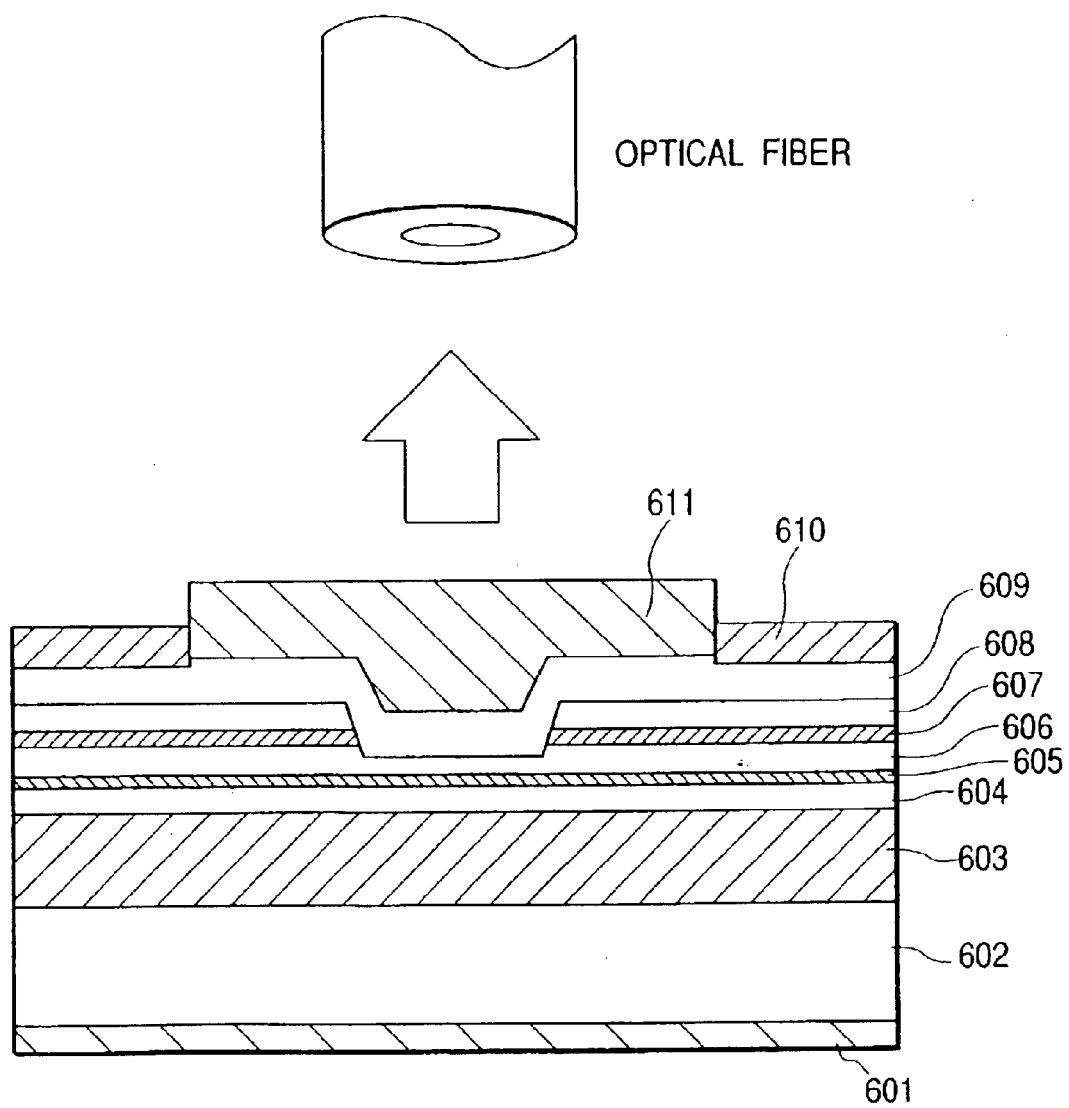
FIG. 6 is a cross section of a conventional vertical cavity surface emitting laser device.
Figure 7:
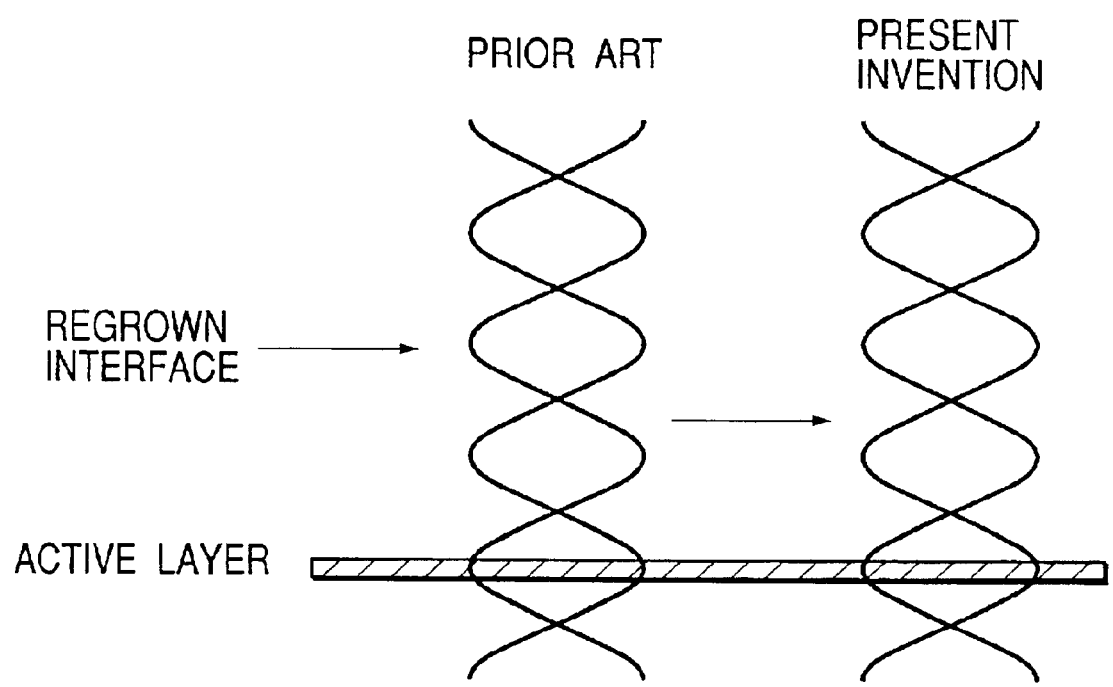
FIG. 7 is a diagram for explaining that a regrown interface does not become a cause of absorption or scattering of a laser beam by adjusting the position of the regrown interface to a node of a standing wave.
Figure 8:
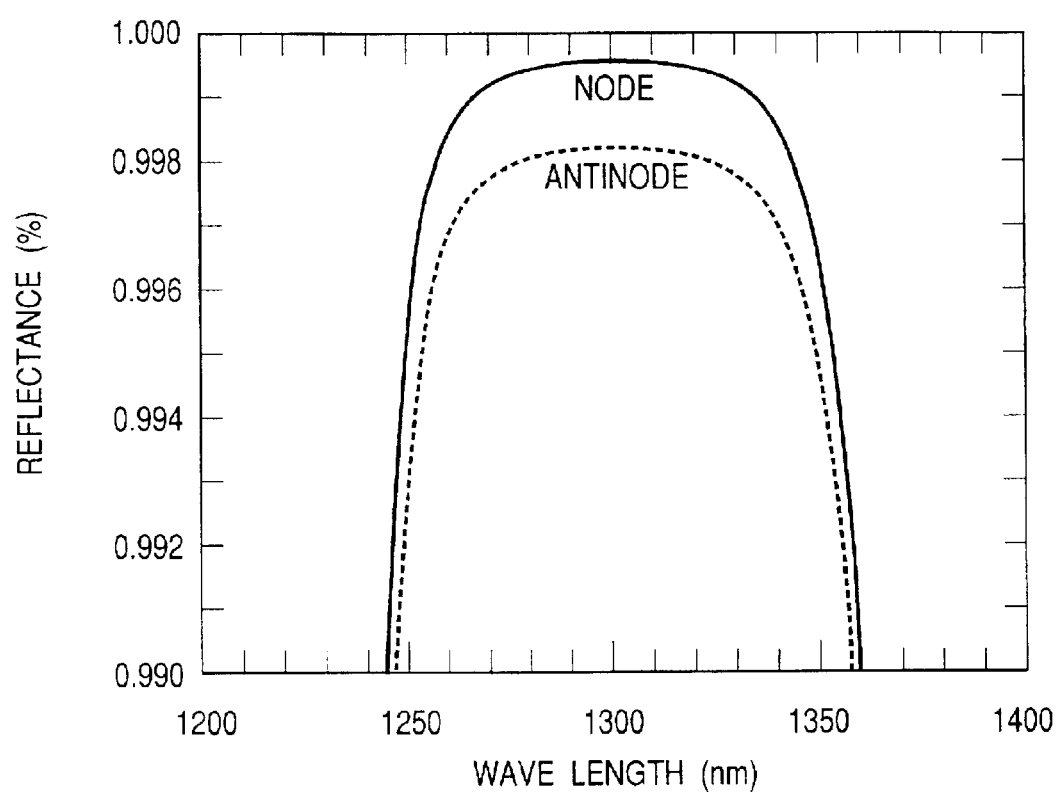
FIG. 8 is a characteristic diagram for explaining the influence of a loss of light depending on the position of the interface.
Figure 9:
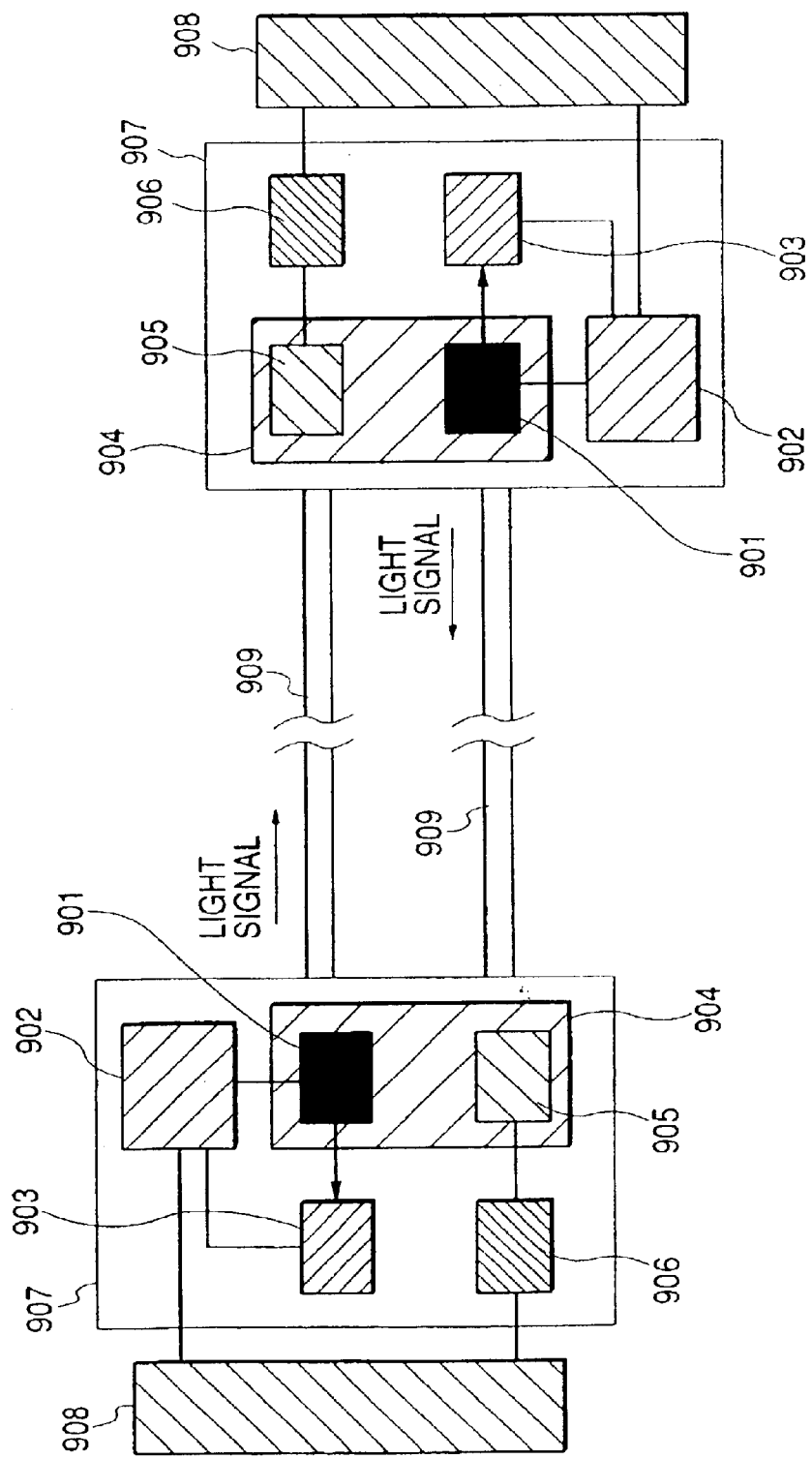
FIG. 9 is a configuration diagram of a optical communication system using a conventional semiconductor laser.

FIGS. 4A and 4B are cross sections showing the structure of further another example of a semiconductor laser according to the invention. The semiconductor layer is a distributed feedback semiconductor laser of a horizontal type. FIG. 4A is a cross section perpendicular to a optical beam direction. FIG. 4B is a cross section in the optical axial direction of FIG. 4A.

On a p-GaAs substrate 401, a p-AlGaAs cladding layer 402, a diffracting grating 403, a p-AlGaAs guide layer 404, a GaNAsSb non-strained active layer 405, and an n-AlGaAs cladding layer 407 are sequentially stacked, thereby forming a mesa stripe. On side faces of the mesa stripe, a p-AlGaAs buried layer 412, an n-AlGaAs buried layer 413, and a p-AlGaAs buried layer 414 are buried. Further, on the cladding layer and buried layer, an n-AlGaAs planarization layer 415, an n-GaAs gap layer 408, and an SiO2 current blocking layer 406 are stacked, and an n-electrode 411 is formed. On the under face of the p-GaAs substrate 401, a p-electrode 412 is formed. Although the above configuration is a conventionally known one, in the embodiment, a layer containing a dopant by carbon delta doping which is performed just before growing a p-AlGaAs guide layer as a regrown layer on the diffraction grating is formed. Consequently, an adverse influence of impurity which occurs at the time of forming the diffraction grating is lessened, and resistance between the electrodes 411 and 412 is reduced.

According to the invention, in the semiconductor laser fabricated with a regrowing process, by performing delta doping for electrically lessening the adverse influence of a contamination deposit on the regrown interface, a semiconductor laser with sufficiently low device resistance, capable of performing ultra high speed operation can be fabricated with high reproducibility. Therefore, higher performance and lower cost of a high-speed optical module using a semiconductor laser as a light source can be realized. Further, when the semiconductor laser is a vertical cavity surface light emitting laser, by adjusting the position of the regrown interface containing a dopant by delta doping to the node of the standing wave, the regrown interface does not become a factor of absorbing or scattering a laser beam. Thus, higher speed operation can be realized and light emitting characteristics of the semiconductor laser can be improved.

What is claimed is:

1. A vertical cavity surface emitting semiconductor laser for emitting light perpendicular to a substrate crystal comprising:

a lower multilayer reflecting mirror on said substrate crystal, a first spacer layer on the lower multilayer reflecting mirror, an active layer on the first spacer layer for generating light, a second spacer layer on the active layer, a current blocking layer having an aperture for passing a laser beam from the light generated from said active layer on the second spacer layer, a current feeding layer on the current blocking layer, a third spacer layer on the current feeding layer and on the second spacer layer through the aperture and an upper multilayer reflecting mirror on the third spacer layer, wherein the third spacer layer is a regrown layer and a delta-doped thin film doped dopant is provided in a regrown interface formed between said second spacer layer and third spacer layer or in the vicinity of the regrown interface.

2. The vertical cavity surface emitting semiconductor laser according to claim 1, wherein said regrown interface is formed in a position close to the position of a node of a standing wave in said vertical cavity surface emitting semiconductor laser within a distance of a ⅛ wavelength or less.

3. The vertical cavity surface emitting semiconductor laser according to claim 1, wherein said dopant is carbon.

4. The vertical cavity surface emitting semiconductor laser according to claim 1, wherein said substrate crystal is made of GaAs, the active layer is a strained quantum well layer made of GaInNAs/GaAs or GaInAs/GaAs, the upper and lower reflecting mirrors are semiconductor multilayer film made of GaAs/AlAs or GaAs/AlInP, and the regrown layer is a GaAs spacer layer formed on a GaAs spacer layer formed on said active layer.

5. The vertical cavity surface emitting semiconductor laser according to claim 2, wherein said dopant is carbon.

6. The vertical cavity surface emitting semiconductor laser according to claim 5, wherein said substrate crystal is made of GaAs, the active layer is a strained quantum well layer made of GaInNAs/GaAs or GaInAs/GaAs, the upper and lower reflecting mirrors are a semiconductor multilayer film made of GaAs/AlAs or GaAs/AlInP, and the regrown layer is a GaAs spacer layer formed on a GaAs spacer layer formed on said active layer.

7. The vertical cavity surface emitting semiconductor laser according to claim 3, wherein said substrate crystal is made of GaAs, the active layer is a strained quantum well layer made of GaInNAs/GaAs or GaInAs/GaAs, the upper and lower reflecting mirrors are a semiconductor multilayer film made of GaAs/AlAs or GaAs/AlInP, and the regrown layer is a GaAs spacer layer formed on a GaAs spacer layer formed on said active layer.

8. An optical module including the semiconductor laser according to claim 1 as a light source.

9. An optical module including the semiconductor laser according to claim 2 as a light source.

10. An optical communication system using the semiconductor laser according to claim 1.

11. An optical communication system using the semiconductor laser according to claim 2.

12. An optical communication system using the optical module according to claim 8.

13. An optical communication system using the optical module according to claim 9.

14. A method of fabricating a vertical cavity surface emitting semiconductor laser having a lower multilayer reflecting mirror on substrate crystal, a lower spacer layer on the lower multilayer reflecting mirror, an active layer on the lower spacer layer for generating light, a second spacer layer on the active layer, a current blocking layer and current feeding layer on the second spacer layer, each of which has portions forming an aperture for passing a laser beam from the light generated from said active layer, and an upper multilayer reflecting mirror on the upper spacer layer, comprising:

a first step a forming the lower multilayer reflecting mirror, the lower spacer layer, the active layer, the second spacer layer, the current blocking layer, the current feeding layer, in that order, on the substrate crystal;

a second step of etching the current blocking layer and the current feeding layer formed by the first step so as to form an aperture for obtaining a laser beam from light generated from an active layer;

a third step o delta-doping dopant on a surface of the second spacer layer, and a step of regrowing a third spacer layer on the current blocking layer and on an aperture portion of the second spacer layer so as to form an upper spacer layer.

* * * * *